(12) United States Patent
Daubenspeck et al.

(10) Patent No.: US 7,777,339 B2
(45) Date of Patent: Aug. 17, 2010

(54) SEMICONDUCTOR CHIPS WITH REDUCED STRESS FROM UNDERFILL AT EDGE OF CHIP

(75) Inventors: Timothy Harrison Daubenspeck, Colchester, VT (US); Jeffrey Peter Gambino, Westford, VT (US); Christopher David Muzzy, Burlington, VT (US); Wolfgang Sauter, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 68 days.

(21) Appl. No.: 11/830,228

(22) Filed: Jul. 30, 2007

(65) Prior Publication Data

US 2009/0032929 A1 Feb. 5, 2009

(51) Int. Cl.
*H01L 23/48* (2006.01)
*H01L 23/52* (2006.01)
*H01L 29/40* (2006.01)

(52) U.S. Cl. ............................ 257/758; 257/E23.173

(58) Field of Classification Search ............... 257/778, 257/750, 758, E23.173
See application file for complete search history.

(56) References Cited

U.S. PATENT DOCUMENTS

| | | | | |
|---|---|---|---|---|
| 6,331,736 B1* | 12/2001 | Duesman et al. | ............ | 257/778 |
| 6,441,488 B1* | 8/2002 | Smith | ............ | 257/738 |
| 6,607,970 B1* | 8/2003 | Wakabayashi | ............ | 438/462 |
| 6,847,066 B2* | 1/2005 | Tahara et al. | ............ | 257/243 |
| 6,914,333 B2* | 7/2005 | Lo et al. | ............ | 257/737 |
| 2006/0017161 A1* | 1/2006 | Chung et al. | ............ | 257/737 |

\* cited by examiner

*Primary Examiner*—David A Zarneke
*Assistant Examiner*—Jenny L Wagner
(74) *Attorney, Agent, or Firm*—Schmeiser, Olsen & Watts; Richard M. Kotulak

(57) ABSTRACT

Structures and methods for forming the same. A semiconductor chip includes a semiconductor substrate and a transistor on the semiconductor substrate. The chip further includes N interconnect layers on top of the semiconductor substrate and being electrically coupled to the transistor, N being a positive integer. The chip further includes a first dielectric layer on top of the N interconnect layers, and a second dielectric layer on top of the first dielectric layer. The second dielectric layer is in direct physical contact with each interconnect layer of the N interconnect layers. The chip further includes an underfill layer on top of the second dielectric layer. The second dielectric layer is sandwiched between the first dielectric layer and the underfill layer. The chip further includes a laminate substrate on top of the underfill layer. The underfill layer is sandwiched between the second dielectric layer and the laminate substrate.

20 Claims, 9 Drawing Sheets

SEMICONDUCTOR CHIPS WITH REDUCED STRESS FROM UNDERFILL AT EDGE OF CHIP

FIELD OF THE INVENTION

The present invention relates to semiconductor chips, and more specifically, to semiconductor chips in which underfill layers are not likely to create cracks.

BACKGROUND OF THE INVENTION

In a conventional semiconductor chip, underfill layers that fill the space between the laminate substrate and the semiconductor chip, can create cracks in the chip. Therefore, there is a need for a structure (and method of forming the same), in which underfill layers are not likely to create cracks in the semiconductor chip.

SUMMARY OF THE INVENTION

The present invention provides a semiconductor chip, comprising (a) a semiconductor substrate; (b) a transistor on the semiconductor substrate; (c) N interconnect layers on top of the semiconductor substrate and the transistor, wherein N is a positive integer, and wherein the transistor is electrically coupled to the N interconnect layers; (d) a first dielectric layer on top of the N interconnect layers; (e) a second dielectric layer on top of the first dielectric layer, wherein the second dielectric layer is in direct physical contact with each interconnect layer of the N interconnect layers; (f) an underfill layer on top of the second dielectric layer, wherein the second dielectric layer is sandwiched between the first dielectric layer and the underfill layer; and (g) a laminate substrate on top of the underfill layer, wherein the underfill layer is sandwiched between the second dielectric layer and the laminate substrate.

The present invention provides a structure (and method of forming the same), in which underfill layers are not likely to create cracks in the semiconductor chip.

DETAILED DESCRIPTION OF THE INVENTION

Figure 1A:
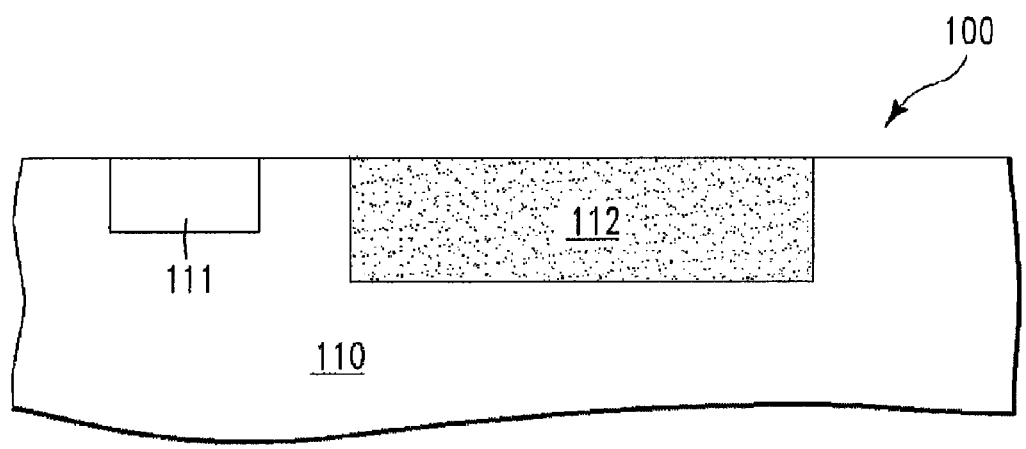
FIGS. 1A-1N (cross-section views) illustrate a fabrication process for forming a semiconductor chip, in accordance with embodiments of the present invention.
Figure 1B:
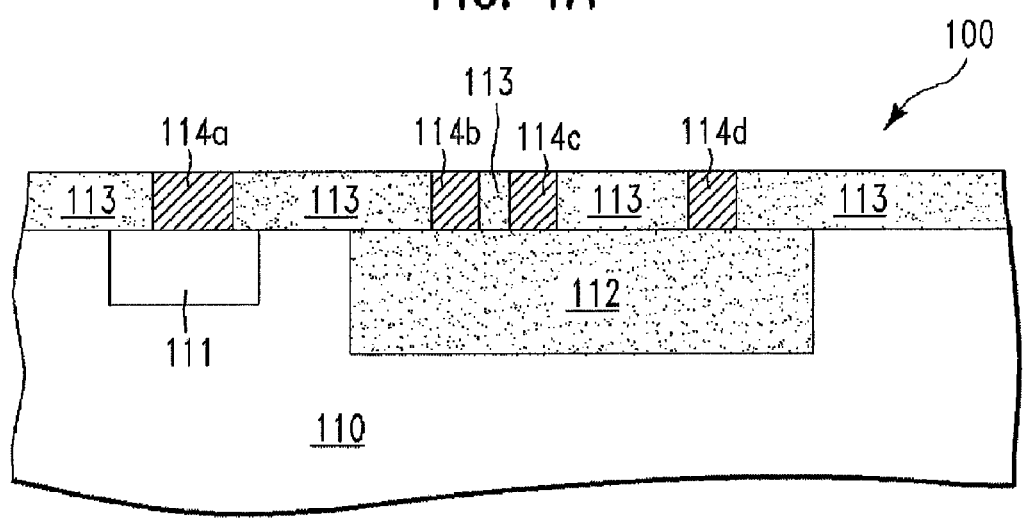
Figure 1C:
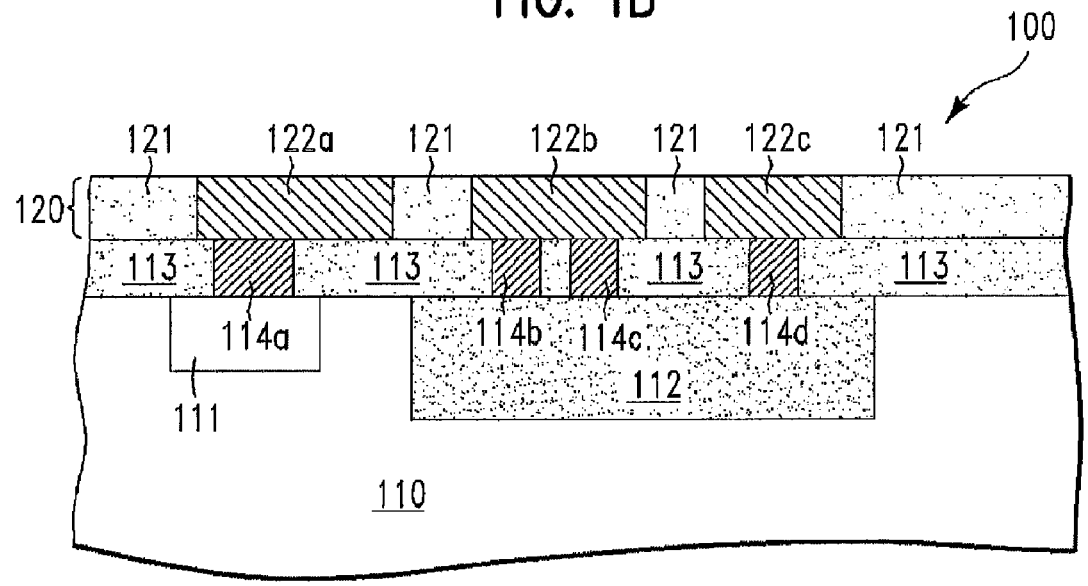
Figure 1D:
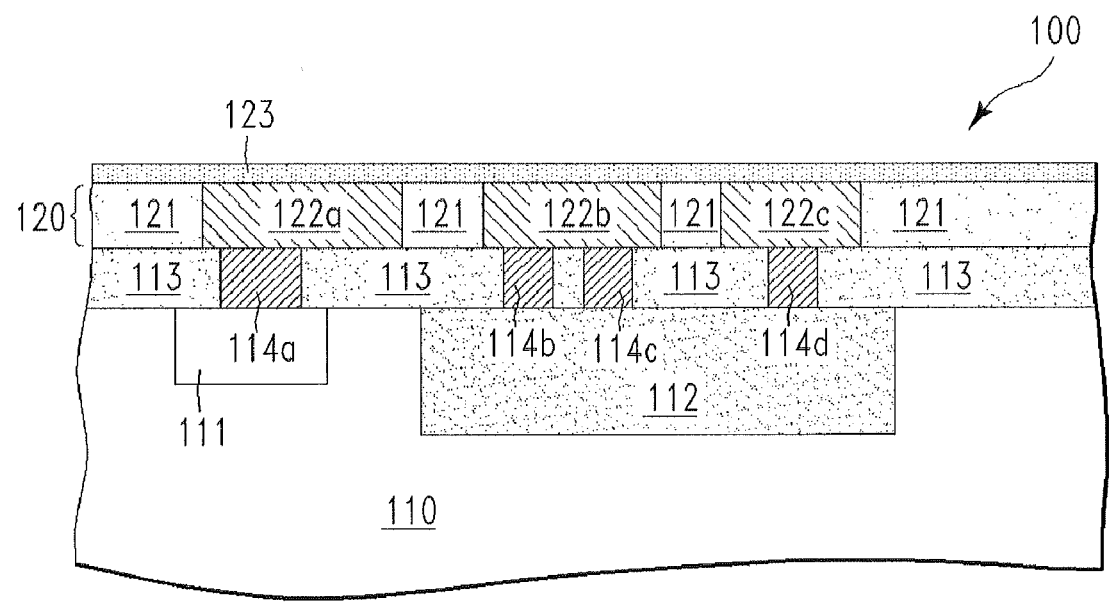
Figure 1E:
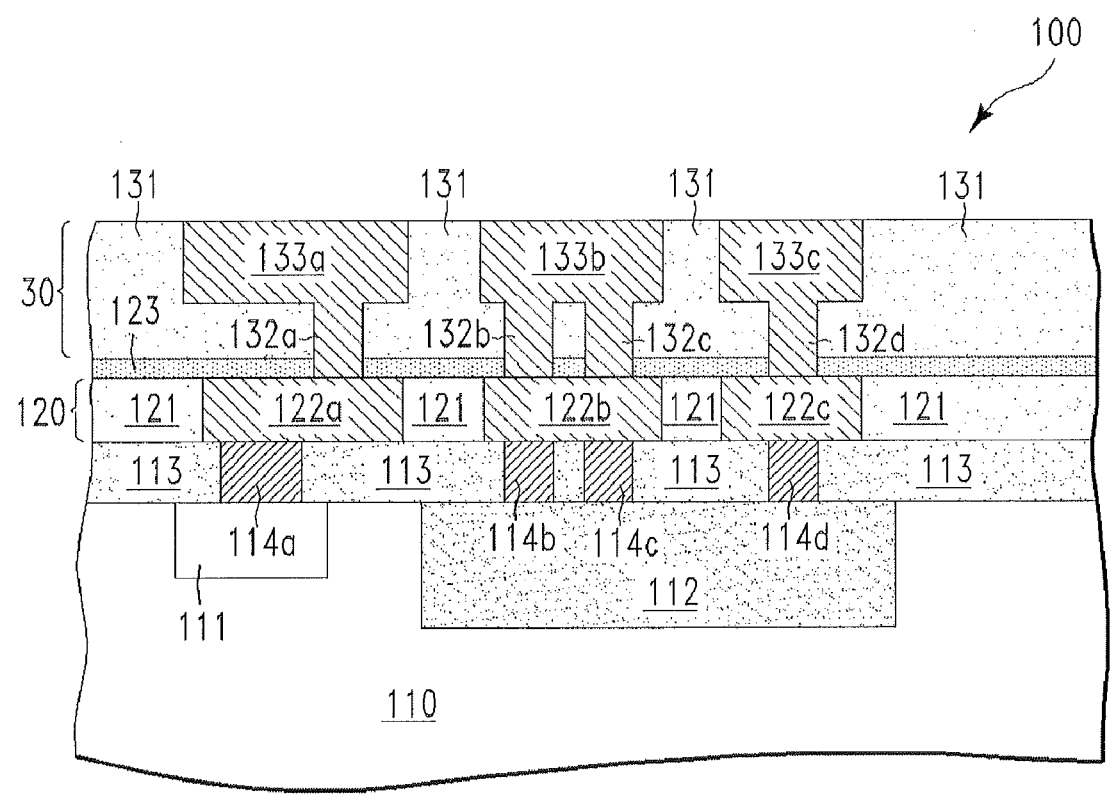
Figure 1F:
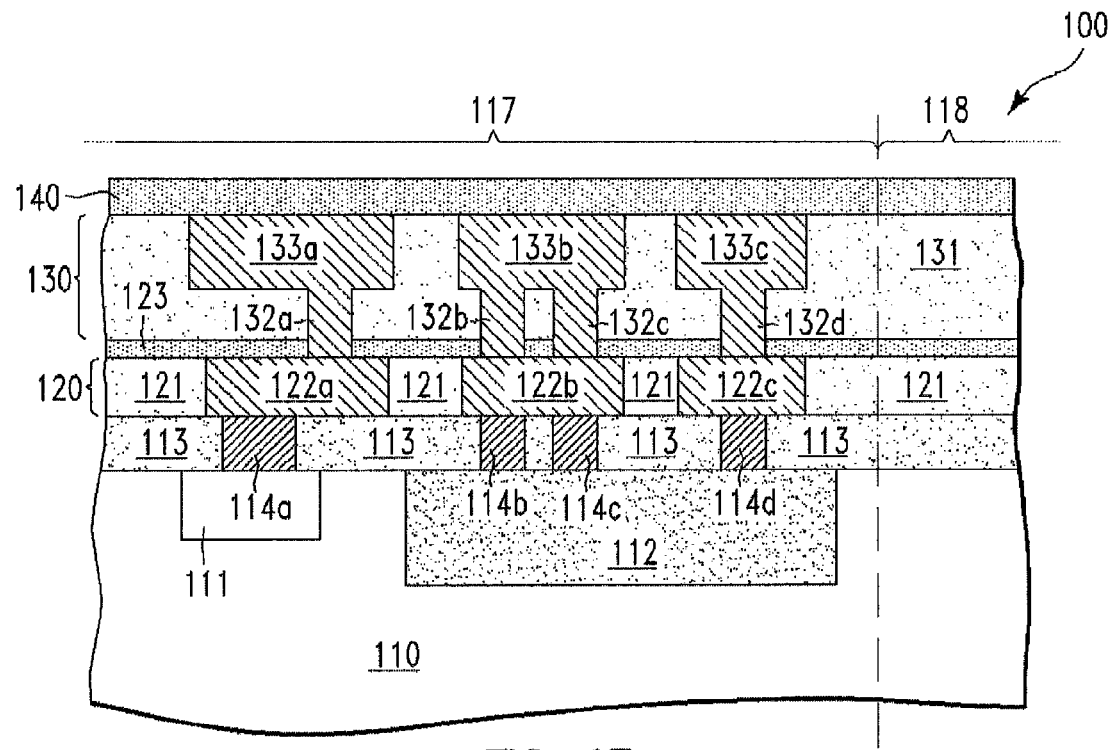
Figure 1G:
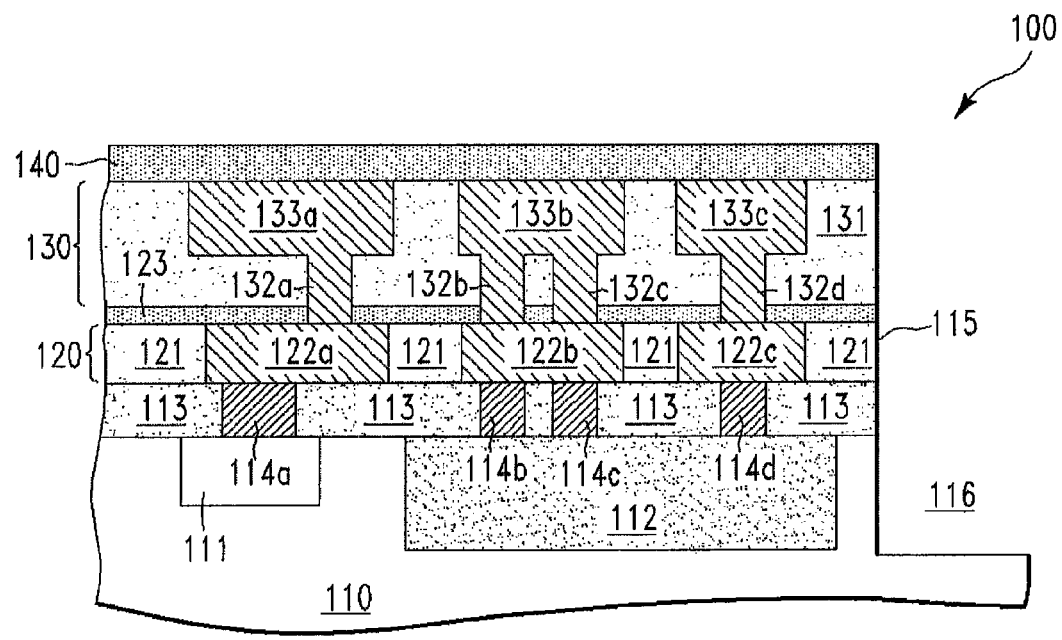
Figure 1H:
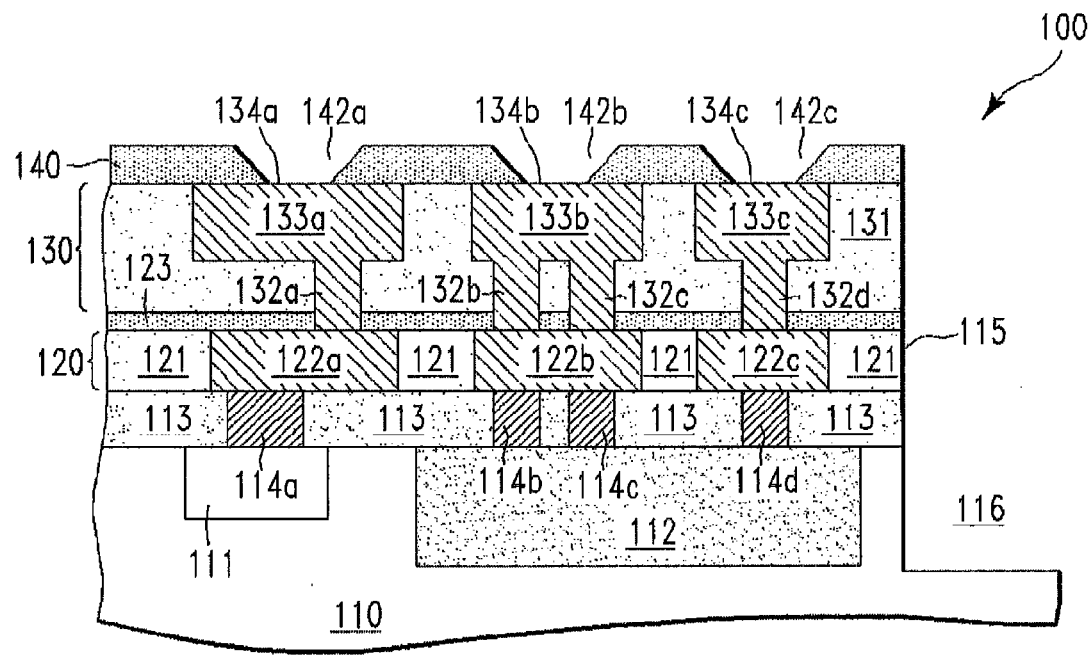
Figure 1I:
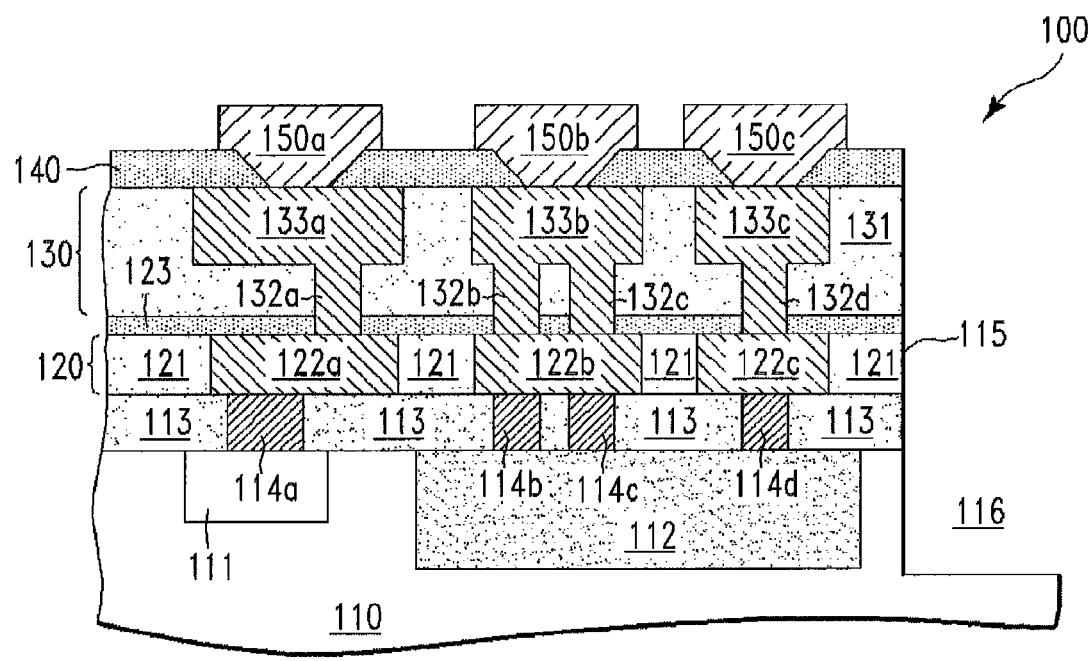
Figure 1J:
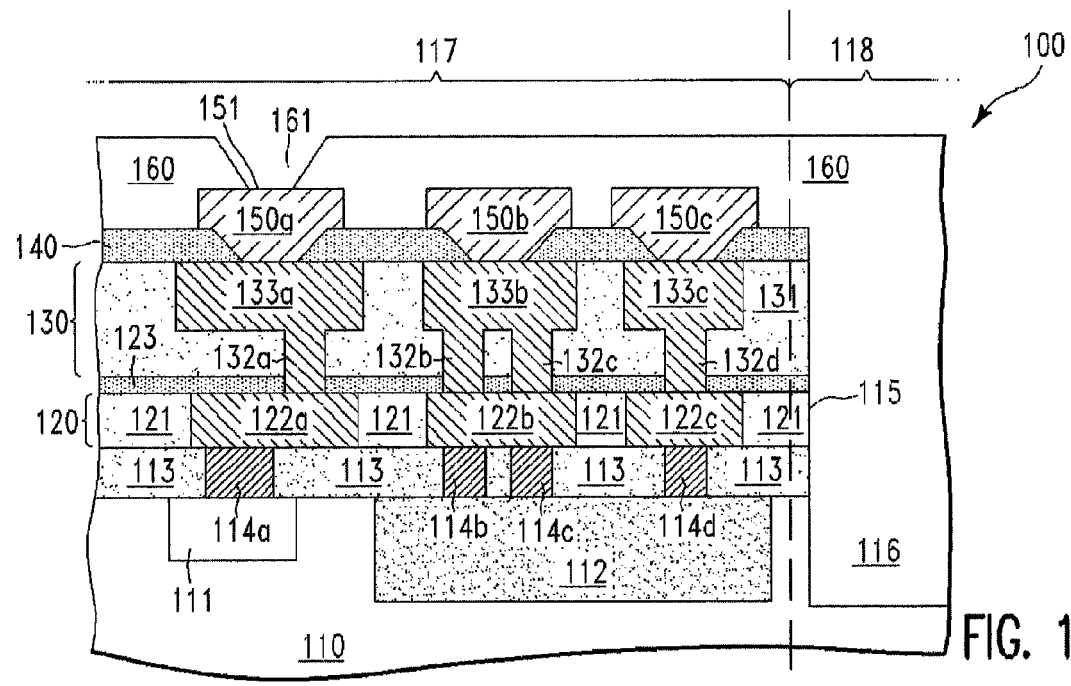
Figure 1K:
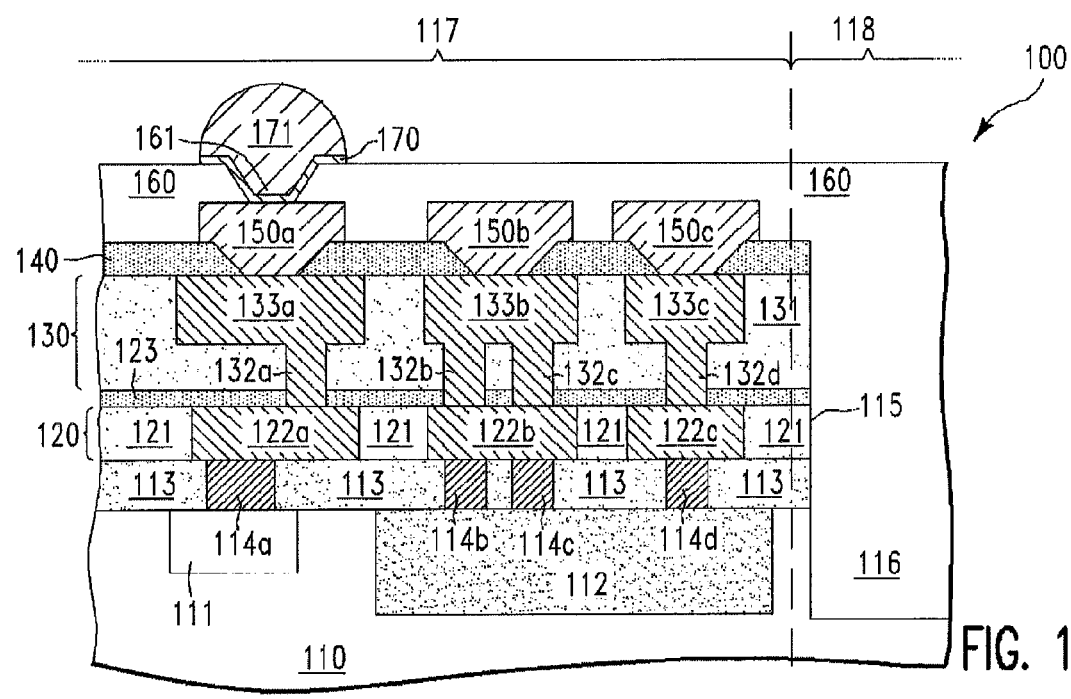
Figure 1L:
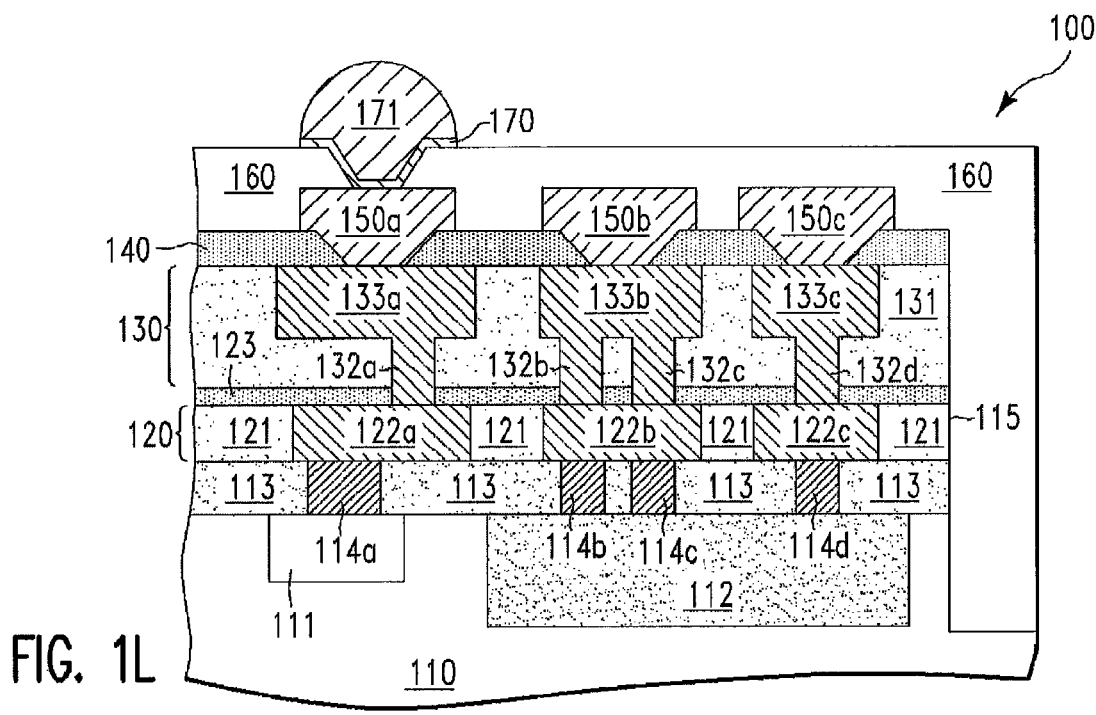
Figure 1M:
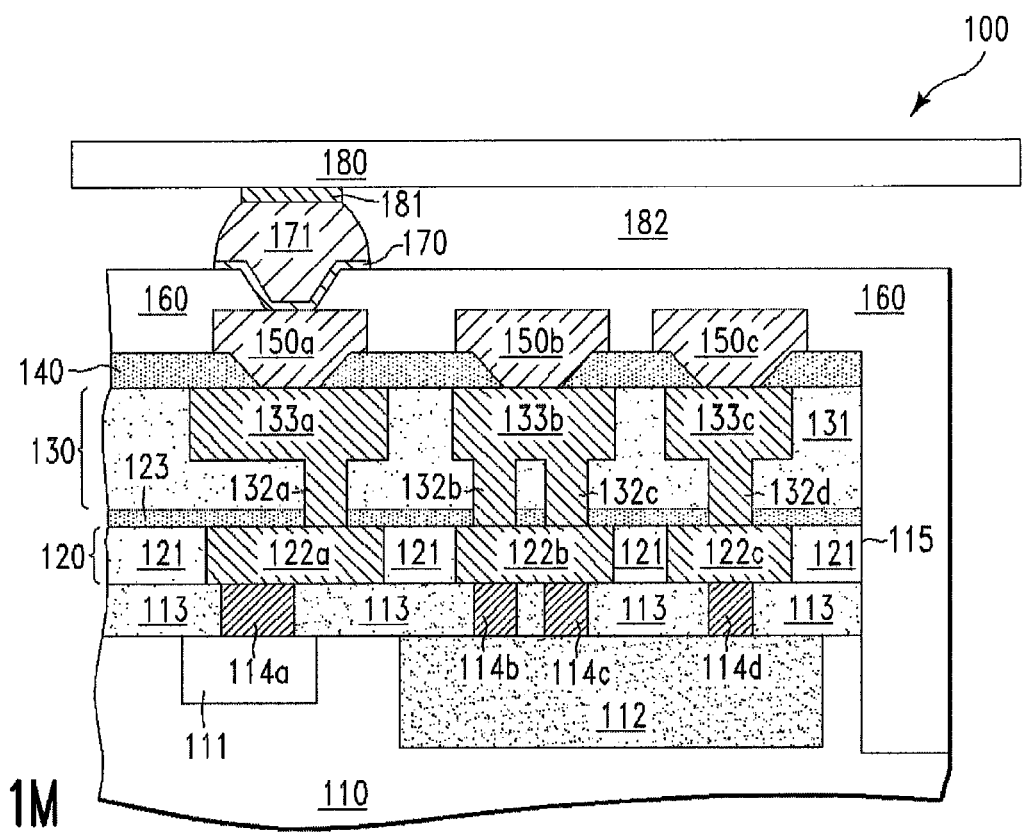
Figure 1N:
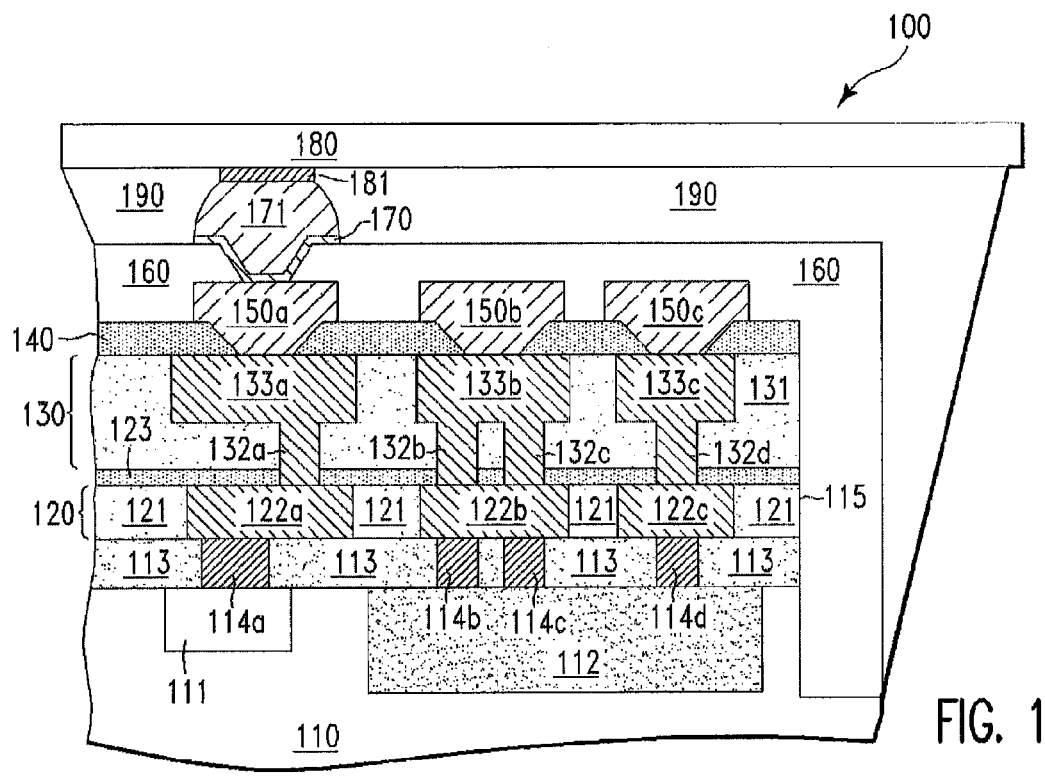

FIGS. 1A-1N (cross-section views) illustrate a fabrication process for forming a semiconductor chip 100, in accordance with embodiments of the present invention. More specifically, with reference to FIG. 1A, the fabrication of the semiconductor structure 100 starts with a semiconductor (silicon, germanium, etc.) substrate 110.

Next, in one embodiment, transistors (only a source/drain region 111 of one of the transistors is shown for simplicity) and a STI (Shallow Trench Isolation) region 112 are formed on the semiconductor substrate 110 by using conventional methods. The STI region 112 comprises a dielectric material such as silicon dioxide.

Next, with reference to FIG. 1B, in one embodiment, a BPSG (Boro-Phospho-Silicate Glass) layer 113 is formed on top of the entire structure 100 of FIG. 1A. The BPSG layer 113 can be formed by CVD (Chemical Vapor Deposition) of BPSG material on top of the entire structure 100 of FIG. 1A, followed by a CMP (Chemical Mechanical Polishing) step.

Next, in one embodiment, contact regions 114a, 114b, 114c, and 114d are formed in the BPSG layer 113 by using a conventional method. The contact region 114a is electrically coupled to the source/drain region 111, whereas the contact regions 114b, 114c, and 114d are in direct physical contact with the STI region 112. The contact regions 114a, 114b, 114c, and 114d can comprise tungsten. There is a thin metal (e.g., Titanium (Ti)) liner layer (not shown) on side walls and a bottom wall of the contact region 114a.

Next, with reference to FIG. 1C, in one embodiment, an interconnect layer 120 is formed on top of the structure 100 of FIG. 1B by using a conventional method. The interconnect layer 120 includes (i) a dielectric layer 121, and (ii) metal lines 122a, 122b, and 122c in the dielectric layer 121. The metal line 122a is electrically coupled to the contact region 114a, whereas the metal lines 122b, 122c are in direct physical contact with the contact regions 114b and 114c and the contact region 114d, respectively. The metal lines 122a, 122b, and 122c can comprise copper. In an alternative embodiment, there are thin metal (e.g., tantalum nitride) liner layers (not shown) on side walls and bottom walls of the metal lines 122a, 122b, and 122c.

Next, with reference to FIG. 1D, in one embodiment, a nitride layer 123 is formed on top of the structure 100 of FIG. 1C. The nitride layer 123 can be formed by CVD of silicon nitride on top of the interconnect layer 120.

Next, with reference to FIG. 1E, in one embodiment, an interconnect layer 130 is formed on top of the nitride layer 123 by using a conventional method. The interconnect layer 130 includes (i) a dielectric layer 131 on top of the nitride layer 123, (ii) metal vias 132a, 132b, 132c, and 132d embedded in the dielectric layer 131, and (iii) metal lines 133a, 133b, and 133c electrically coupled to the metal via 132a, the metal vias 132b and 132c, and the metal via 132d, respectively. The metal via 132a is electrically coupled to the metal line 122a, whereas the metal vias 132b and 132c and the metal via 132d are in direct physical contact with the metal lines 122b and 122c, respectively. The metal vias 132a, 132b, 132c, and 132d and metal lines 133a, 133b, and 133c can comprise copper. In an alternative embodiment, there are thin metal (e.g., tantalum nitride) liner layers (not shown) on side walls and bottom walls of the metal vias 132a, 132b, 132c, and 132d and metal lines 133a, 133b, and 133c.

Next, with reference to FIG. 1F, in one embodiment, a dielectric layer 140 (comprising nitride in one embodiment) is formed on top of the structure 100 of FIG. 1E. The nitride layer 140 can be formed by CVD of silicon nitride on top of the interconnect layer 130. The structure 100 comprises a chip region 117 and a dicing channel region 118, which are separated by a dashed line as shown in FIG. 1F.

Next, in one embodiment, the structure 100 is diced (by a laser beam (not shown) in one embodiment) at the dicing channel region 118 until a portion of the semiconductor substrate 110 is removed, resulting in a dicing trench 116 (FIG. 1G).

Next, with reference to FIG. 1H, in one embodiment, a hole 142a and trenches 142b and 142c are created in the nitride layer 140 by etching the nitride layer 140 until top surfaces 134a, 134b, and 134c of the metal lines 133a, 133b, and 133c, respectively, are exposed to the surrounding ambient. The step of etching the nitride layer 140 to form the hole 142a and trenches 142b and 142c can involve photo-lithography and then dry etching.

Next, with reference to FIG. 1I, in one embodiment, pads 150a, 150b, and 150c (comprising aluminum (Al) in one embodiment) are formed on top of the structure 100 of FIG. 1H such that (i) the Al pads 150a, 150b, and 150c fill the hole 142a and trenches 142b and 142c, respectively, and (ii) the Al pad 150a is electrically coupled to the metal line 133a. The Al pads 150a, 150b, and 150c can be formed by (a) forming a conformal Al layer (not shown) on the entire structure 100 of FIG. 1H including in the hole 142a and trenches 142b and 142c and on side walls and bottom wall of the dicing trench 116, and then (b) directionally and selectively etching back the Al layer stopping at the nitride layer 140. The directional and selective etching in step (b) may be performed using traditional lithographic and etching processes such that what remains of the Al layer after the etching are the Al pads 150a, 150b, and 150c.

In one embodiment, the side wall of the dicing trench 116 is slanted (85-89 degrees), and the etching of the Al layer in step (b) above has a small isotropic component (10-50 nm). As a result, the etching of the Al layer in step (b) above can completely remove Al from the side walls and bottom wall of the dicing trench 116.

The Al pad 150b, the metal lines 133b and 122b, the vias 132b and 132c, and the contact regions 114b and 114c can be collectively referred to as an edge seal region 114b+114c+ 122b+132b+132c+133b+150b. The Al pad 150c, the metal lines 133c and 122c, the via 132c, and the contact region 114d can be collectively referred to as a crack stop region 114d+ 122c+132d+133c+150c. The edge seal region 114b+114c+ 122b+132b+132c+133b+150b and the crack stop region 114d+122c+132d+133c+150c each form a closed loop on a perimeter of the semiconductor chip 100 and prevent cracks from propagating from the edge of semiconductor chip 100 into the center of semiconductor chip 100.

Next, with reference to FIG. 1J, in one embodiment, a photosensitive polyimide (PSPI) layer 160 is formed on top of the entire structure 100 of FIG. 1I. More specifically, the PSPI layer 160 is formed by spin-applying a solvent-soluble polyimide on the entire structure 100 of FIG. 1I including in the dicing trench 116.

Next, in one embodiment, a hole 161 is created in the PSPI layer 160 such that a top surface 151 of the Al pad 150a is exposed to the surrounding ambient via the hole 161. More specifically, the hole 161 is formed in the PSPI layer 160 by using a conventional lithographic process. It should be noted that polyimide is a photosensitive polymer. After forming the hole 161, the PSPI layer 160 is cured at a high temperature (between 150 C and 400 C) to remove the solvent and to cross-link the polymer.

Next, with reference to FIG. 1K, in one embodiment, a bump limiting metallurgy (BLM) region 170 and a solder bump 171 are formed in the hole 161 and on top of the Al pad 150a by using a conventional method. The solder bump 171 and the BLM region 170 are electrically coupled to the Al pad 150a. The BLM region 170 can comprise multiple layers of titanium-tungsten (TiW), copper (Cu), chrome (Cr), and gold (Au), whereas the solder bump 171 can comprise a mixture of silver (Ag) and tin (Sn).

Next, in one embodiment, a chip dicing process is performed wherein a blade (not shown) can be used to cut through the dicing channel region 118, resulting in the separated semiconductor chip 100 in FIG. 1L. It is should be noted that the PSPI layer 160 is still on a side wall 115.

Next, with reference to FIG. 1M, in one embodiment, the chip 100 (in FIG. 1L) is aligned to a laminate substrate 180. Then, the solder bump 171 is bonded directly to a pad 181 of the laminate substrate 180 at a high temperature (above the melting point of the solder) and then cooled down.

Next, in one embodiment, space 182 between the PSPI layer 160 and the laminate substrate 180 is filled with an underfill material (e.g., epoxy with silicon dioxide filler) resulting in an underfill layer 190 in FIG. 1N.

It should be noted that the material of the PSPI layer 160 (polyimide) is flexible, therefore, cracks are not likely to occur at the side wall 115 (the interfacing surface between the PSPI layer 160 and the interconnect layers 120 and 130 in FIG. 1N).

Figure 2A:
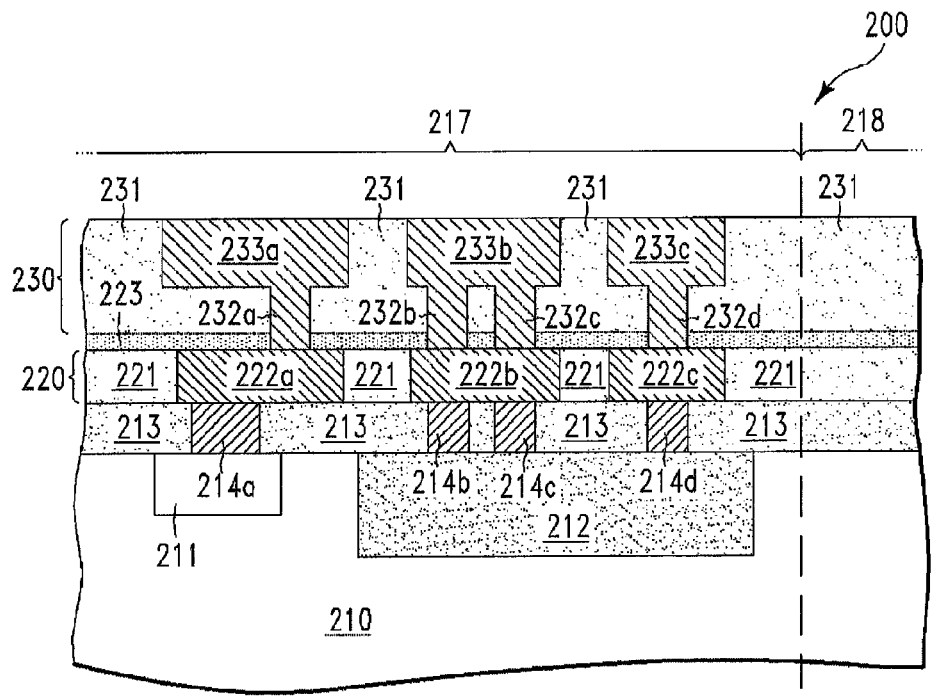
FIGS. 2A-2D (cross-section views) illustrate a fabrication process for forming a semiconductor chip, in accordance with embodiments of the present invention.

FIGS. 2A-2D (cross-section views) illustrate a fabrication process for forming a semiconductor chip 200, in accordance with embodiments of the present invention. More specifically, the fabrication process starts out with the structure 200 of FIG. 2A. In one embodiment, the structure 200 of FIG. 2A is similar to the structure 100 of FIG. 1E. It should be noted that similar regions of the structure 200 of FIG. 2A and the structure 100 of FIG. 1E have the same reference numerals, except for the first digit, which is used to indicate the figure number. For instance, an interconnect layer 230 (FIG. 2A) and the interconnect layer 130 (FIG. 1E) are similar.

Figure 2B:
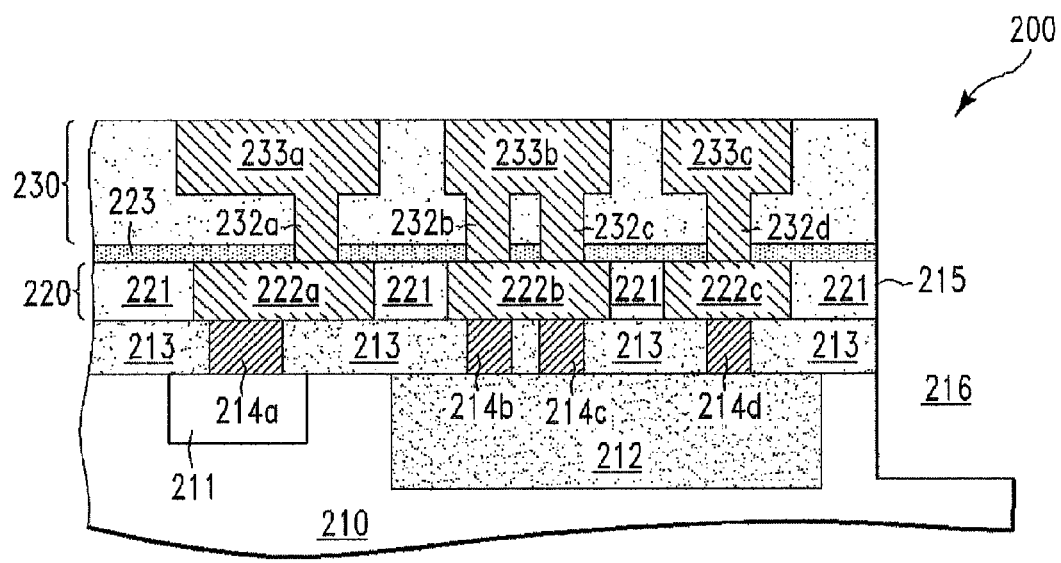

Next, in one embodiment, the structure 200 is diced (by a laser beam (not shown) in one embodiment) at the dicing channel region 218 until a portion of the semiconductor substrate 210 is removed, resulting in a dicing trench 216 (FIG. 2B).

Figure 2C:
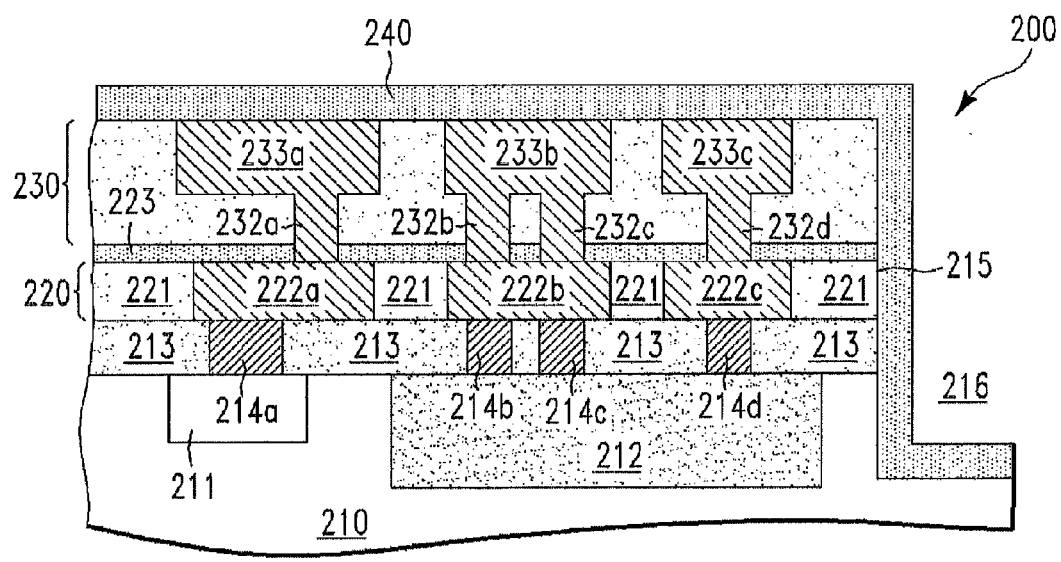

Next, with reference to FIG. 2C, in one embodiment, a dielectric layer 240 (comprising nitride in one embodiment) is formed on top of the entire structure 200 of FIG. 2B. The nitride layer 240 can be formed by CVD of silicon nitride on top of the entire structure 200 of FIG. 2B. It should be noted that the nitride layer 240 is on side walls and a bottom wall of the dicing trench 216.

Figure 2D:
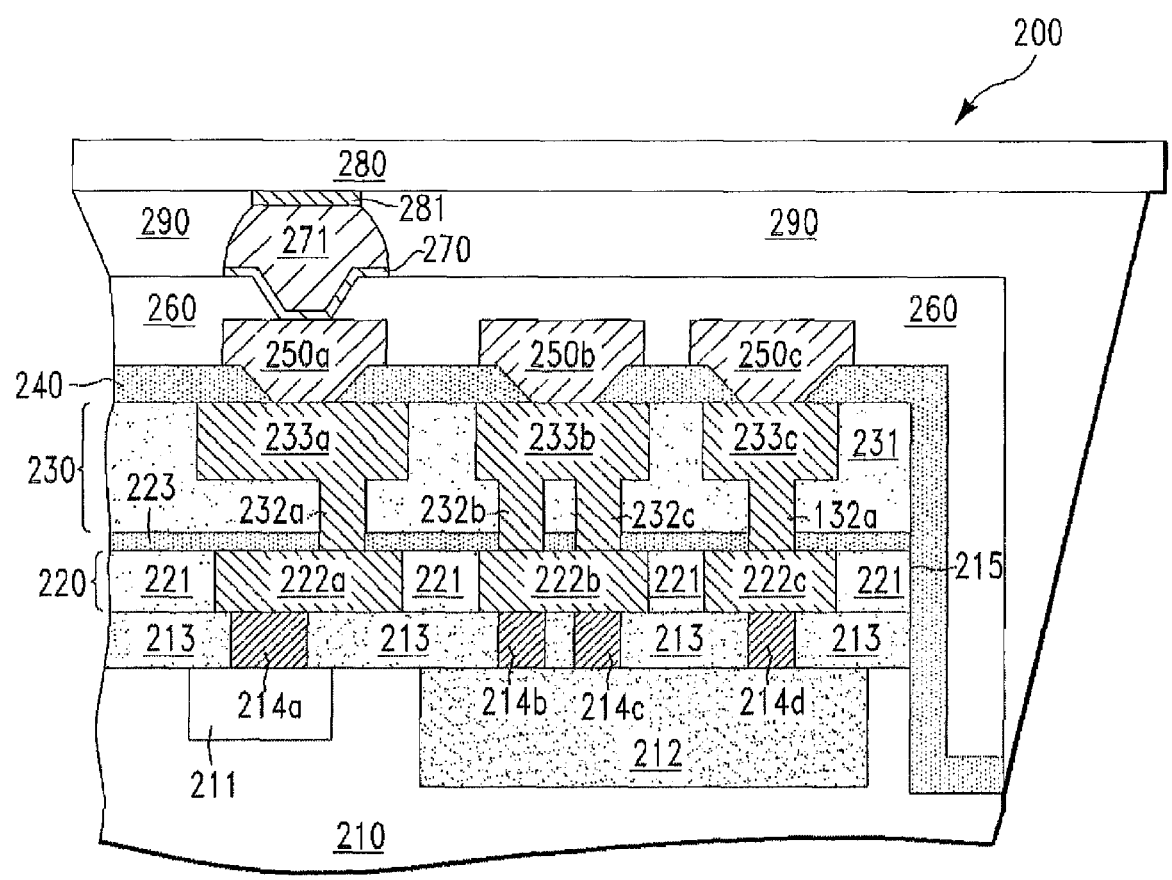

Next, with reference to FIG. 2D, in a manner similar to what is described in FIGS. 1H-1N, pads 250a, 250b, and 250c, a PSPI layer 260, a BLM region 270, a solder bump 271, a laminate substrate 280, and an underfill layer 290 are formed.

It should be noted that the coefficients of thermal extension (CTE) of the nitride layer 240 and the interconnect layers 220 and 230 are not large, and that these layers are thin. Therefore, cracks are not likely to occur at a side wall 215 (the interfacing surface between the nitride layer 240 and the interconnect layers 220 and 230 in FIG. 2D).

In the embodiments above, the semiconductor chip has two interconnect layers. In general, it can have any number of interconnect layers (e.g., 10, 12, etc.).

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor chip, comprising:
   (a) a semiconductor substrate;
   (b) a transistor on the semiconductor substrate;
   (c) N interconnect layers on top of the semiconductor substrate and the transistor,
       wherein N is a positive integer greater than two, and
       wherein the transistor is electrically coupled to the N interconnect layers;
   (d) a first dielectric layer on top of the N interconnect layers;
   (e) a second dielectric layer on top of the first dielectric layer, wherein the second dielectric layer is in direct physical contact with each interconnect layer of the N interconnect layers;

(f) an underfill layer on top of the second dielectric layer, wherein the second dielectric layer is sandwiched between the first dielectric layer and the underfill layer; and (g) a laminate substrate on top of the underfill layer, wherein the underfill layer is sandwiched between the second dielectric layer and the laminate substrate.

2. The structure of claim 1, wherein the first dielectric layer comprises silicon nitride.

3. The structure of claim 2, wherein the second dielectric layer comprises polyimide.

4. The structure of claim 3, wherein the underfill layer comprises epoxy.

5. The structure of claim 1, wherein the underfill layer is not in direct physical contact with any interconnect layer of the N interconnect layers.

6. The structure of claim 1, further comprising an edge seal region and a crack stop region in the N interconnect layers,
wherein the edge seal region forms a first closed loop on a perimeter of the semiconductor chip, and
wherein the crack stop region forms a second closed loop on a perimeter of the semiconductor chip.

7. The structure of claim 1, further comprising a solder bump on the N interconnect layers,
wherein the solder bump is electrically coupled to the transistor through the N interconnect layers.

8. A semiconductor chip, comprising:
(a) a semiconductor substrate;
(b) a transistor on the semiconductor substrate;
(c) N interconnect layers on top of the semiconductor substrate and the transistor,
wherein N is a positive integer greater than two, and
wherein the transistor is electrically coupled to the N interconnect layers;
(d) a first dielectric layer on top of the N interconnect layers,
wherein a first planer vertical surface of the first dielectric layer is in direct physical contact with each interconnect layer of the N interconnect layers;
(e) a second dielectric layer on top of the first dielectric layer;
(f) an underfill layer on top of the second dielectric layer, wherein the second dielectric layer is sandwiched between the first dielectric layer and the underfill layer; and
(g) a laminate substrate on top of the underfill layer, wherein the underfill layer is sandwiched between the second dielectric layer and the laminate substrate.

9. The structure of claim 8, wherein the first dielectric layer comprises silicon nitride.

10. The structure of claim 9, wherein the second dielectric layer comprises polyimide.

11. The structure of claim 10, wherein the underfill layer comprises epoxy.

12. The structure of claim 8, wherein the underfill layer is not in direct physical contact with any interconnect layer of the N interconnect layers.

13. The structure of claim 8, further comprising an edge seal region and a crack stop region in the N interconnect layers,
wherein the edge seal region foams a first closed loop on a perimeter of the semiconductor chip, and
wherein the crack stop region forms a second closed loop on a perimeter of the semiconductor chip.

14. The structure of claim 1, wherein the first dielectric layer extends in a first direction, and wherein the second dielectric layer comprises a first portion extending in the first direction and a second portion extending in a second direction perpendicular to the first direction.

15. The structure of claim 14, wherein the first portion is not in direct physical contact with each said interconnect layer of the N interconnect layers, and wherein the second portion is in direct physical contact with each said interconnect layer of the N interconnect layers.

16. The structure of claim 8, wherein the first dielectric layer comprises a first portion extending in a first direction and a second portion extending in a second direction perpendicular to the first direction, and wherein the second dielectric layer comprises a first portion extending in the first direction and a second portion extending the second direction.

17. The structure of claim 16, wherein the first portion of the first dielectric layer is not in direct physical contact with each said interconnect layer of the N interconnect layers, and wherein the second portion of the first dielectric layer is in direct physical contact with each said interconnect layer of the N interconnect layers.

18. The structure of claim 16, wherein the first dielectric layer comprises a third portion extending in the first direction, wherein the first portion of the first dielectric layer is parallel to the third portion of the first dielectric layer, and wherein the first portion of the first dielectric layer is not in a same plane as the third portion of the first dielectric layer.

19. The structure of claim 8, further comprising:
a nitride layer formed between a first interconnect layer of the N interconnect layers and a second interconnect layer of the N interconnect layers, wherein said nitride layer is in direct physical contact with the first planer vertical surface of the first dielectric layer; and
a boro-phospho-silicate glass layer formed between the first interconnect layer of the N interconnect layers and the semiconductor substrate, wherein the boro-phospho-silicate glass layer is in direct physical contact with the first planer vertical surface of the first dielectric layer.

20. The structure of claim 8, wherein said first planer vertical surface of the first dielectric layer is in direct physical contact with the semiconductor substrate, and wherein said first planer vertical surface of the first dielectric layer is in direct physical contact with a non-conductive portion of each said interconnect layer of the N interconnect layers.

* * * * *